US009455669B2

(12) United States Patent
Modi et al.

(10) Patent No.: US 9,455,669 B2
(45) Date of Patent: Sep. 27, 2016

(54) APPARATUS AND METHODS FOR PHASE COMPENSATION IN POWER AMPLIFIERS

(71) Applicant: Skyworks Solutions, Inc., Woburn, MA (US)

(72) Inventors: Hardik Bhupendra Modi, Irvine, CA (US); Sabah Khesbak, Irvine, CA (US); Guohao Zhang, Nanjing (CN)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 52 days.

(21) Appl. No.: 14/509,344

(22) Filed: Oct. 8, 2014

(65) Prior Publication Data

US 2015/0105033 A1   Apr. 16, 2015

Related U.S. Application Data

(60) Provisional application No. 61/890,120, filed on Oct. 11, 2013.

(51) Int. Cl.

| H01Q 11/12 | (2006.01) |
| H04B 1/04 | (2006.01) |
| H03G 3/00 | (2006.01) |
| H03F 3/16 | (2006.01) |
| H03F 1/02 | (2006.01) |

(Continued)

(52) U.S. Cl.
CPC ............ *H03F 1/0222* (2013.01); *H03F 1/565* (2013.01); *H03F 3/191* (2013.01); *H03F 2200/102* (2013.01); *H03F 2200/207* (2013.01); *H03F 2200/391* (2013.01); *H03F 2200/451* (2013.01); *H03F 2200/504* (2013.01); *H03F 2203/21193* (2013.01)

(58) Field of Classification Search
CPC ...... H04B 1/04; H04B 1/0458; H04B 1/116; H04B 1/1607; H04B 1/40; H04B 17/13; H04B 2001/0408; H04B 2001/0416; H04M 1/0202; H04M 19/08; H03F 1/0211; H03F 1/56; H03F 3/211; H03F 2200/102; H03F 2200/375; H03F 2200/451; H03F 2200/504
USPC ............... 455/127.1, 127.2, 127.3, 572, 574; 330/84, 124 R, 127, 250, 277, 295, 296, 330/297
See application file for complete search history.

(56) References Cited

U.S. PATENT DOCUMENTS 7,071,775 B2 * 7/2006 Gailus ...................... H03F 1/02
                                                                330/124 R
8,098,093 B1 * 1/2012 Li ........................ H03F 1/0222
                                                                330/127

(Continued)

*Primary Examiner* — Quochien B Vuong
(74) *Attorney, Agent, or Firm* — Knobbe Martens Olson & Bear LLP

(57) ABSTRACT

Apparatus and methods for phase compensation in power amplifiers are disclosed herein. In certain implementations, a power amplifier includes an input stage, an output stage, an envelope tracker, and a compensation circuit. The input and output stages are cascaded and amplify an input RF signal to generate an amplified output RF signal. The envelope tracker generates a power amplifier supply voltage for at least the output stage based on an envelope of the input RF signal. The compensation circuit compensates for changes in input impedance of the output stage associated with changes in the voltage level of the power amplifier supply voltage. By including the compensation circuit, a variation in the power amplifier's phase delay versus input power can be reduced, thereby leading to an improvement in the power amplifier's phase distortion (AM/PM).

20 Claims, 9 Drawing Sheets

(51) Int. Cl.
*H03F 1/56* (2006.01)
*H03F 3/191* (2006.01)

(56) References Cited

U.S. PATENT DOCUMENTS 8,416,023 B2 * 4/2013 van Rijs ............... H03F 1/0222
330/277

8,598,950 B2 12/2013 Khesbak
8,717,100 B2 5/2014 Reisner et al.
8,761,698 B2 * 6/2014 Langer ................. H04B 1/0458
455/127.1
8,797,103 B2 8/2014 Kaczman et al.
9,219,877 B2 * 12/2015 Holland ................... H03H 7/40
2014/0306756 A1 * 10/2014 Henshaw ............. H03F 1/0227
330/127

* cited by examiner

APPARATUS AND METHODS FOR PHASE COMPENSATION IN POWER AMPLIFIERS

CROSS-REFERENCE TO RELATED APPLICATIONS

This application claims the benefit of priority under 35 U.S.C. §119(e) of U.S. Provisional Patent Application No. 61/890,120, filed Oct. 11, 2013 and titled "APPARATUS AND METHODS FOR PHASE COMPENSATION IN POWER AMPLIFIERS", which is herein incorporated by reference in its entirety.

BACKGROUND

1. Field

Embodiments of the invention relate to electronic systems, and in particular, to power amplifiers for radio frequency (RF) electronics.

2. Description of the Related Technology

Power amplifiers can be included in mobile devices to amplify a radio frequency (RF) signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify an RF signal having a relatively low power. It can be important to manage the amplification of an RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is controlled in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

SUMMARY

In certain embodiments, the present disclosure relates to a method of phase compensation in a power amplifier system. The method includes amplifying an input radio frequency (RF) signal to generate a first amplified RF signal using a first amplification stage of a power amplifier, generating a power amplifier supply voltage using an envelope tracker, controlling a voltage level of the power amplifier supply voltage based on an envelope of the input RF signal using the envelope tracker, powering a second amplification stage of the power amplifier using the power amplifier supply voltage from the envelope tracker, amplifying the first amplified RF signal to generate a second amplified signal using the second amplification stage, and compensating for a variation in an input impedance of the second amplification stage associated with changes in the voltage level of the power amplifier supply voltage using a compensation circuit.

In some embodiments, the method further includes providing a matching impedance between the first and second amplification stages that is in the range of about 60Ω to about 70Ω using the compensation circuit.

In a number of embodiments, amplifying the first amplified RF signal to generate the second amplified signal includes receiving the first amplified RF signal at a base of a bipolar transistor and generating the second amplified RF signal at a collector of the bipolar transistor. In various embodiments, the method further includes compensating for a variation in a parasitic capacitance between the base and the collector of the bipolar transistor associated with changes in the voltage level of the power amplifier supply voltage using the compensation circuit.

According to several embodiments, the method further includes generating the RF signal and the envelope of the RF signal using a transceiver.

In certain embodiments, the present disclosure relates to a power amplifier system. The power amplifier system includes a first power amplifier stage including an input configured to receive an input RF signal and an output configured to generate a first amplified RF signal. The power amplifier system further includes an envelope tracker configured to generate a power amplifier supply voltage and to control a voltage level of the power amplifier supply voltage based on an envelope of the input RF signal. The power amplifier system further includes a second power amplifier stage including an input configured to receive the first amplified RF signal and an output configured to generate a second amplified RF signal. The second power amplifier stage is configured to be powered by the power amplifier supply voltage from the envelope tracker. The power amplifier system further includes a compensation circuit electrically connected between the output of the first power amplifier stage and the input of the second power amplifier stage. The compensation circuit is configured to compensate for variation in input impedance of the second power amplifier stage associated with changes in the voltage level of the power amplifier supply voltage.

In some embodiments, the compensation circuit is configured to provide a matching impedance between the first and second power amplifier stages that is in the range of about 60Ω to about 70Ω.

In various embodiments, the second power amplifier stage includes a bipolar transistor including a base configured to receive the first amplified RF signal and a collector configured to generate the second amplified RF signal. According to several embodiments, the compensation circuit is configured to compensate for a variation in a parasitic capacitance between the base and the collector of the bipolar transistor associated with changes in the voltage level of the power amplifier supply voltage.

In certain embodiments, the compensation circuit includes a first compensation capacitor electrically connected between the input of the second power amplifier stage and an output of the first power amplifier stage.

In several embodiments, the compensation circuit further includes a first compensation inductor electrically connected between the output of the first power amplifier stage and an input stage power supply. According to numerous embodiments, the compensation circuit further includes a second compensation inductor electrically connected between the first compensation inductor and the input stage power supply, and the first and second compensation inductors are electrically connected at a first node. In various embodiments, the compensation circuit further includes a third compensation inductor and a second compensation capacitor electrically connected in series between the first node and a power low supply.

According to some embodiments, the power amplifier system further includes an output stage bias current generation circuit configured to provide a bias current to the input of the second power amplifier stage. In several embodiments, the compensation circuit further includes a bias inductor configured to provide the bias current from the output stage bias current generation circuit to the input of the second power amplifier stage, and the bias inductor is configured to provide a portion of the first amplified RF signal to the output stage bias current generation circuit so as to provide phase compensation.

In certain embodiments, the present disclosure relates to a mobile device. The mobile device includes a transceiver configured to generate an RF signal and an envelope signal corresponding to an envelope of the RF signal, an envelope tracker configured to generate a power amplifier supply voltage and to control a voltage level of the power amplifier supply voltage based on the envelope signal, and a plurality of power amplifier stages including a first power amplifier stage and a second power amplifier stage. The first power amplifier stage includes an input configured to receive the RF signal and an output configured to generate a first amplified RF signal. The second power amplifier stage includes an input configured to receive the first amplified RF signal and an output configured to generate a second amplified RF signal, and the second power amplifier stage is further configured to be powered by the power amplifier supply voltage from the envelope tracker. The mobile device further includes a compensation circuit electrically connected between the output of the first power amplifier stage and an input of the second power amplifier stage. The compensation circuit is configured to compensate for variation in input impedance of the second power amplifier stage associated with changes in the voltage level of the power amplifier supply voltage.

In some embodiments, the compensation circuit is configured to provide a matching impedance between the first and second power amplifier stages that is in the range of about 60Ω to about 70Ω.

In a number of embodiments, the second power amplifier stage includes a bipolar transistor including a base configured to receive the first amplified RF signal and a collector configured to generate the second amplified RF signal. In various embodiments, the compensation circuit is configured to compensate for a variation in a parasitic capacitance between the base and the collector of the bipolar transistor associated with changes in the voltage level of the power amplifier supply voltage.

In some embodiments, the transceiver includes an envelope shaping block for shaping the envelope signal to control a gain compression associated with the envelope tracker.

DETAILED DESCRIPTION OF EMBODIMENTS

The headings provided herein, if any, are for convenience only and do not necessarily affect the scope or meaning of the claimed invention.

Overview of Power Amplifier Systems that can Include Compensation Circuits

Figure 1:
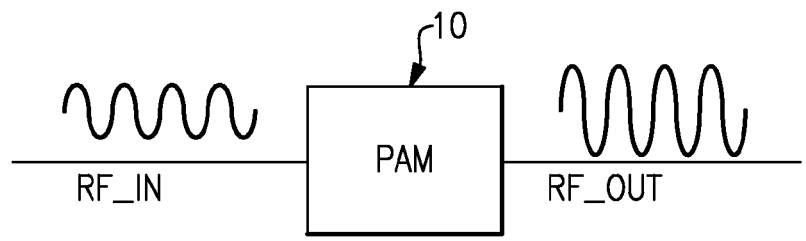
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF signal RF_IN to generate an amplified RF signal RF_OUT. As described herein, the power amplifier module 10 can include one or more power amplifiers implemented in accordance with the teachings herein.

Figure 2:
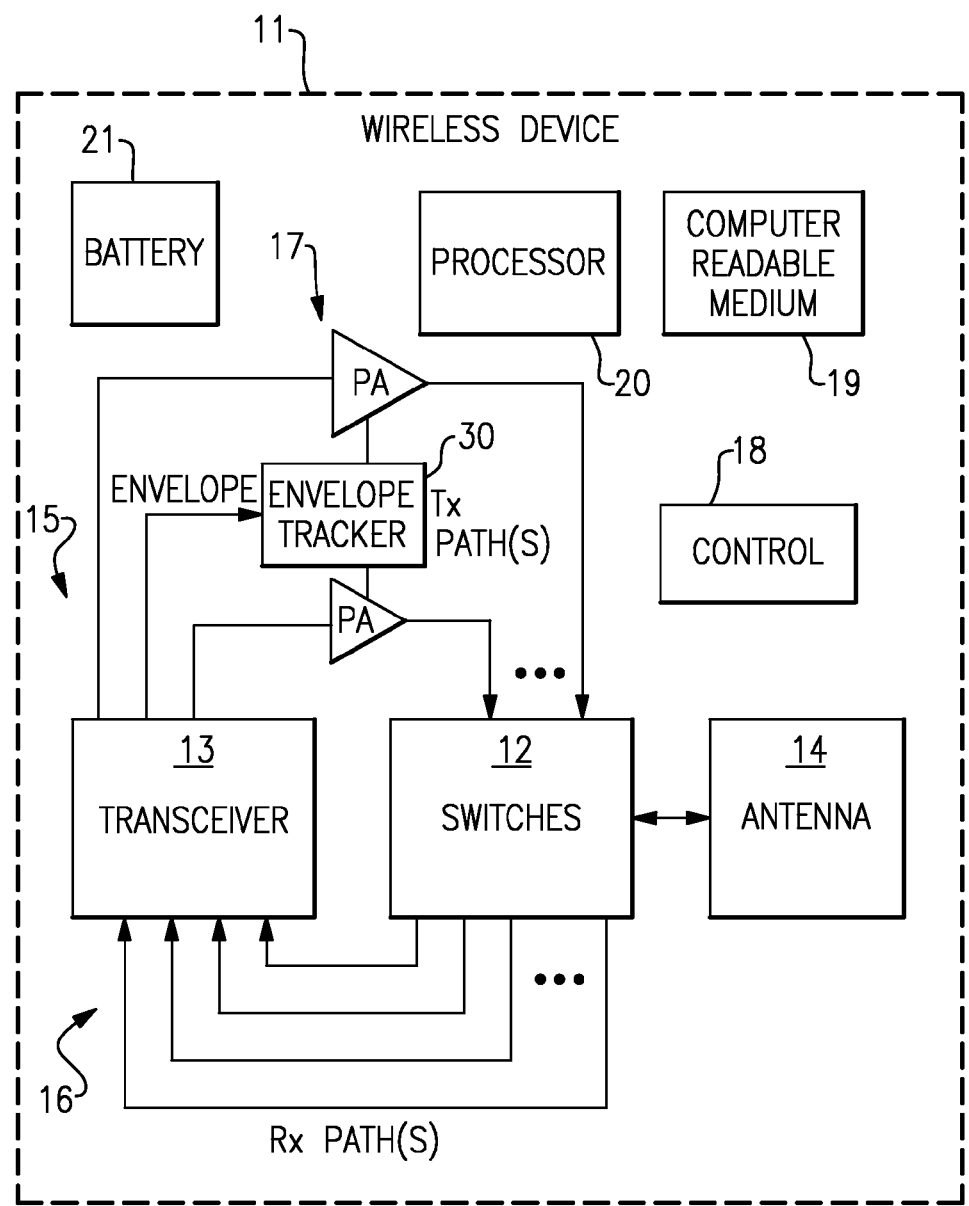
FIG. 2 is a schematic block diagram of an example wireless device that can include one or more of the power amplifier modules of FIG. 1.

FIG. 2 is a schematic block diagram of an example wireless device 11 that can include one or more of the power amplifier modules 10 of FIG. 1. The wireless device 11 can include power amplifiers implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more radio frequency spectrum bands.

One or more features of the present disclosure can be implemented in the foregoing example modes and/or bands, and in other communication standards. For example, 3G and 4G are non-limiting examples of such standards.

In certain embodiments, the wireless device 11 can include switches 12, a transceiver 13, an antenna 14, power amplifiers 17, a control component 18, a computer readable medium 19, a processor 20, a battery 21, and an envelope tracker 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, the envelope tracker 30, and/or other operating components.

In certain embodiments, a processor 20 can be configured to facilitate implementation of various processes described herein. In certain embodiments, the processor 20 can operating using computer program instructions stored in a computer-readable memory 19 that can direct the processor 20 in a particular manner.

The illustrated wireless device 11 also includes the envelope tracker 30, which can be used to generate a power amplifier supply voltage for one or more of the power amplifiers 17. For example, the envelope tracker 30 can control or vary the voltage level of the supply voltage provided to the power amplifiers 17 based upon an envelope of the RF signal to be amplified.

The envelope tracker 30 can be powered by the battery 21. The battery 21 can be any suitable battery for use in the wireless device 11, including, for example, a lithium-ion battery. As will be described in detail further below, by controlling the voltage level of the power amplifier supply voltage provided to the power amplifiers, the power consumed from the battery 21 can be reduced, thereby improving performance of the battery life of the wireless device 11. In certain implementations, the envelope tracker 30 can receive the envelope signal from the transceiver 13. However, the envelope can be determined in other ways, such as detecting the envelope from the RF signal using any suitable envelope detector.

Figure 3:
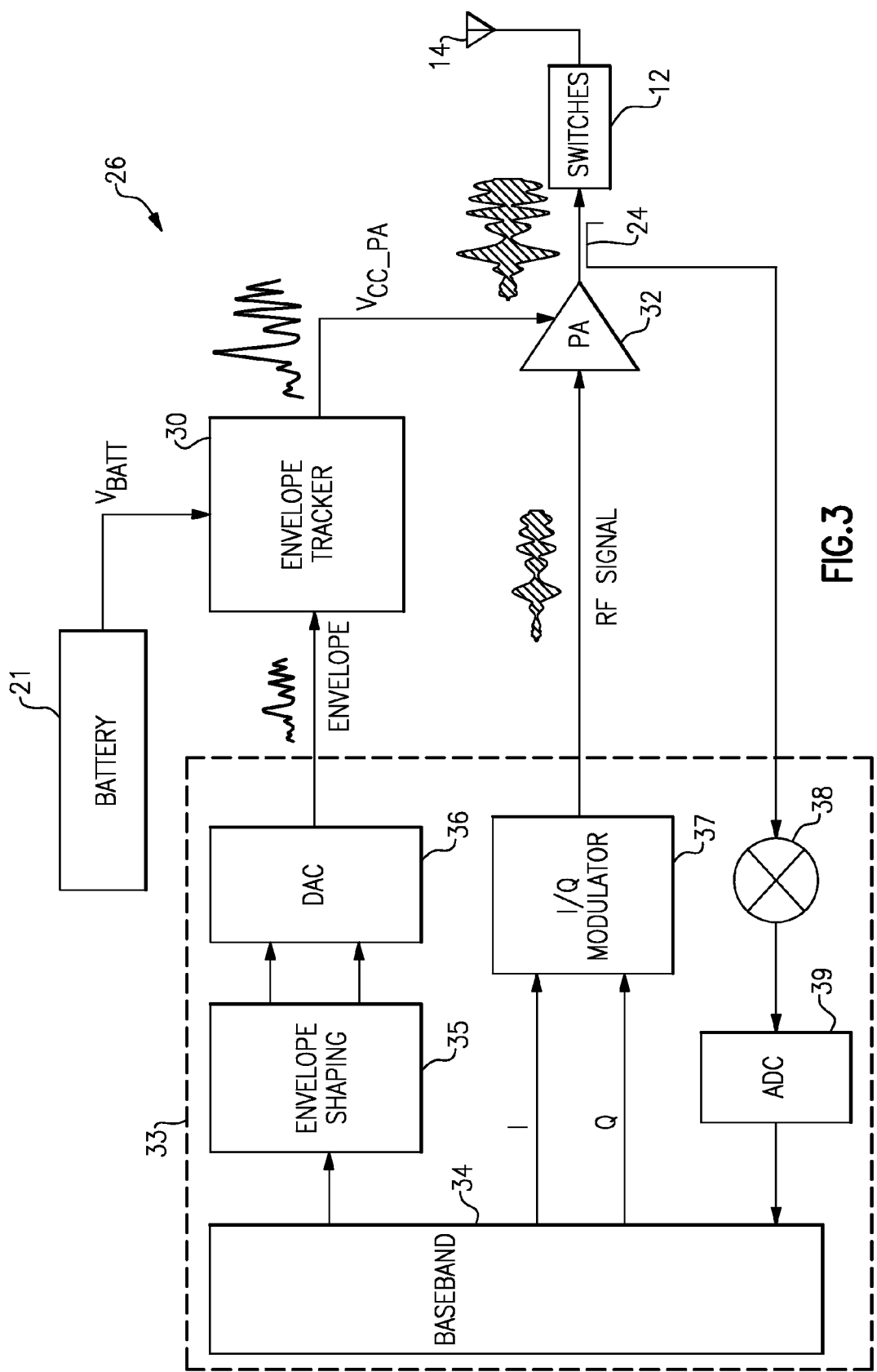
FIG. 3 is a schematic block diagram of one example of a power amplifier system including an envelope tracker.

FIG. 3 is a schematic block diagram of one example of a power amplifier system 26 including an envelope tracker. The illustrated power amplifier system 26 includes the switches 12, the antenna 14, the battery 21, a directional coupler 24, the envelope tracker 30, a power amplifier 32, and a transceiver 33. The illustrated transceiver 33 includes a baseband processor 34, an envelope shaping block 35, a digital-to-analog converter (DAC) 36, an I/Q modulator 37, a mixer 38, and an analog-to-digital converter (ADC) 39.

The baseband processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

The envelope shaping block 35 can be used to convert envelope or amplitude data associated with the I and Q signals into shaped envelope data. Shaping the envelope data from the baseband processor 34 can aid in enhancing performance of the power amplifier system 26 by, for example, adjusting the envelope signal to optimize linearity of the power amplifier 32 and/or to achieve a desired gain compression of the power amplifier 32. In certain implementations, the envelope shaping block 35 is a digital block, and the DAC 36 is used to convert the shaped envelope data into an analog envelope signal suitable for use by the envelope tracker 30. However, in other implementations, the DAC 36 can be omitted in favor of providing the envelope tracker 30 with a digital envelope signal to aid the envelope tracker 30 in further processing of the envelope signal.

The envelope tracker 30 can receive the envelope signal from the transceiver 33 and a battery voltage $V_{BATT}$ from the battery 21, and can use the envelope signal to generate a power amplifier supply voltage $V_{CC\_PA}$ for the power amplifier 32 that changes in relation to the envelope signal. The envelope tracker 30 can control a voltage level of the power amplifier supply voltage $V_{CC\_PA}$ to track or change with the envelope signal to enhance power efficiency.

The power amplifier 32 can receive the RF signal from the I/Q modulator 37 of the transceiver 33, and can provide an amplified RF signal to the antenna 14 through the switches 12.

The directional coupler 24 can be positioned between the output of the power amplifier 32 and the input of the switches 12, thereby allowing an output power measurement of the power amplifier 32 that does not include insertion loss of the switches 12. The sensed output signal from the directional coupler 24 can be provided to the mixer 38, which can multiply the sensed output signal by a reference signal of a controlled frequency so as to downshift the frequency spectrum of the sensed output signal. The downshifted signal can be provided to the ADC 39, which can convert the downshifted signal to a digital format suitable for processing by the baseband processor 34. By including a feedback path between the output of the power amplifier 32 and an input of the baseband processor 34, the baseband processor 34 can be configured to dynamically adjust the I and Q signals and/or envelope data associated with the I and Q signals to optimize the operation of the power amplifier system 26. For example, configuring the power amplifier system 26 in this manner can aid in controlling the power added efficiency (PAE) and/or linearity of the power amplifier 32.

Figure 4A:
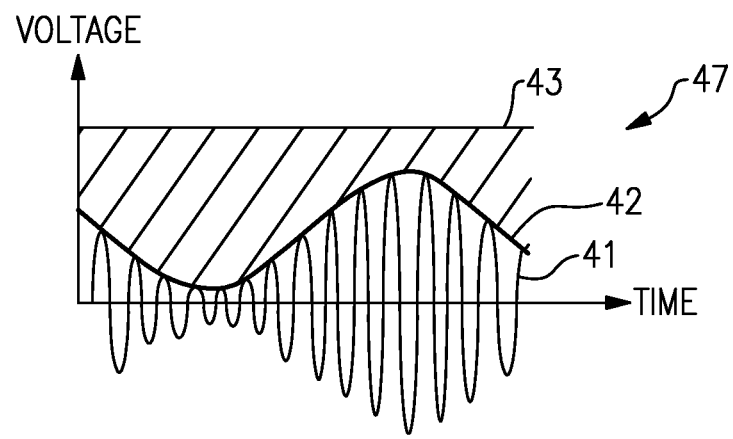
FIGS. 4A and 4B are graphs showing two examples of power amplifier supply voltage versus time.
Figure 4B:
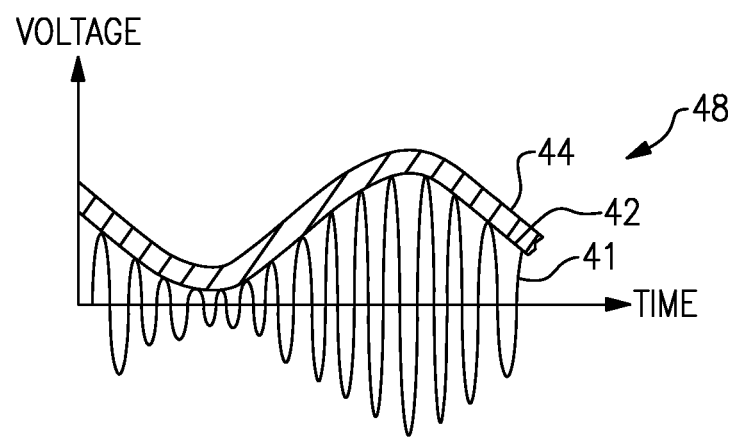

FIGS. 4A and 4B are graphs showing two examples of power amplifier supply voltage versus time.

In FIG. 4A, a graph 47 illustrates the voltage of an RF signal 41 and a power amplifier supply voltage 43 versus time. The RF signal 41 has an envelope 42.

It can be important that the power amplifier supply voltage 43 of a power amplifier has a voltage greater than that of the RF signal 41. For example, providing a power amplifier supply voltage to a power amplifier having a magnitude less than that of the RF signal 41 can clip the RF signal, thereby creating signal distortion and/or impacting signal integrity. Thus, it can be important that the power amplifier supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a mobile device.

In FIG. 4B, a graph 48 illustrates the voltage of an RF signal 41 and a power amplifier supply voltage 44 versus time. In contrast to the power amplifier supply voltage 43 of FIG. 4A, the power amplifier supply voltage 44 of FIG. 4B changes in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

Overview of Power Amplifier Systems Including Compensation Circuits

Power added efficiency (PAE) is one metric for rating a power amplifier and can correspond to the ratio of the difference between the output and input signal power to the DC power consumed by the power amplifier. Additionally, phase distortion (AM/PM) can be another metric for rating a power amplifier, and can correspond to a change in output phase in relation to a change in input power. PAE and AM/PM can be metrics by which customers determine which power amplifiers to purchase, as PAE can impact battery life of an electronic device and AM/PM can impact signal quality of the electronic device. Although high PAE and low AM/PM are desirable, improving AM/PM can come at the cost of reducing PAE, while increasing PAE can degrade AM/PM.

Envelope tracking is a technique that can be used to increase PAE of a power amplifier system by efficiently changing a voltage level of a power amplifier supply voltage over time. However, it has been found that using envelope tracking can also degrade the power amplifier's AM/PM, since variations in bias conditions associated with different power amplifier supply voltage levels can result in impedance changes that can degrade AM/PM by changing the power amplifier's phase delay.

In certain configurations herein, a power amplifier includes an input stage, an output stage, an envelope tracker, and a compensation circuit. The input and output stages are cascaded and amplify an input RF signal to generate an amplified output RF signal. Additionally, the envelope tracker generates a power amplifier supply voltage for at least the output stage, and the compensation circuit compensates for changes in input impedance of the output stage associated with changes in the voltage level of the power amplifier supply voltage. By including the compensation circuit, a variation in the power amplifier's phase delay versus input power can be reduced, thereby leading to an improvement in the power amplifier's AM/PM.

Figure 5:
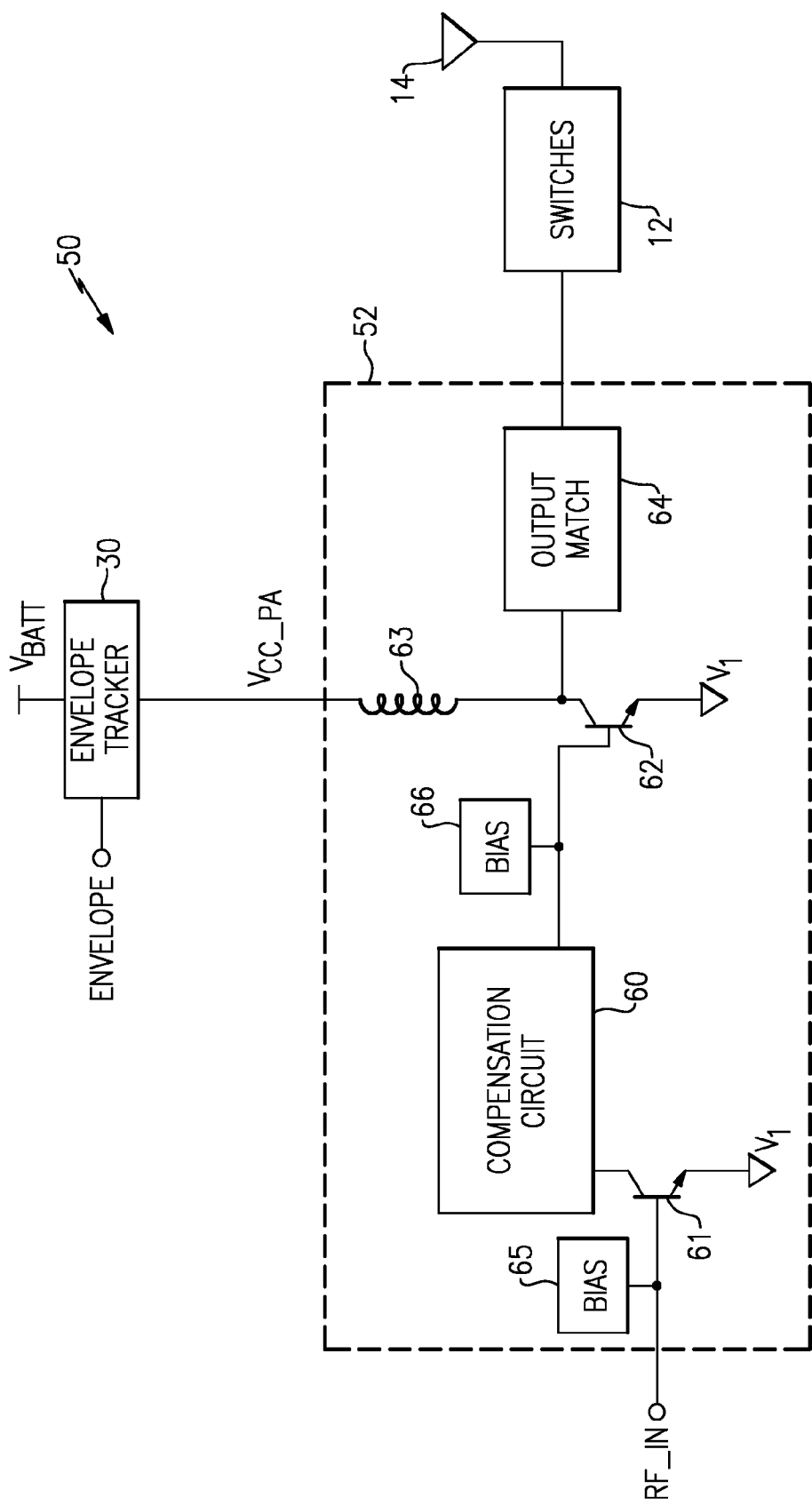
FIG. 5 is a circuit diagram of one embodiment of a power amplifier system including an envelope tracker.

FIG. 5 is a circuit diagram of one embodiment of a power amplifier system 50. The illustrated power amplifier system 50 includes the switches 12, the antenna 14, the envelope tracker 30, and a power amplifier 52. The power amplifier 52 includes a compensation circuit 60, a first or input stage NPN bipolar transistor 61, a second or output stage NPN bipolar transistor 62, a choke inductor 63, an output matching circuit 64, a first or input stage bias circuit 65, and a second or output stage bias circuit 66.

The power amplifier 52 is configured to receive an RF signal RF_IN, and to provide an amplified RF signal to the antenna 14 through the switches 12. The envelope tracker 30 is configured to receive a battery voltage $V_{BATT}$ and an envelope signal ENVELOPE corresponding to an envelope of the RF signal RF_IN. The envelope tracker 30 generates a power amplifier supply voltage $V_{CC\_PA}$ for the power amplifier 52. Additionally, the envelope tracker 30 can control a voltage level of the power amplifier supply voltage $V_{CC\_PA}$ over time using the envelope signal ENVELOPE. For example, when the envelope signal increases, the envelope tracker can increase the voltage level of the power amplifier supply voltage $V_{CC\_PA}$. Additionally, when the envelope signal decreases, the envelope tracker can decrease the voltage level of the power amplifier supply voltage $V_{CC\_PA}$.

The input stage NPN bipolar transistor 61 includes an emitter electrically connected to a first or power low supply voltage $V_1$, which can be, for example, a power low or ground supply. The input stage NPN bipolar transistor 61 further includes a collector electrically connected to a first terminal of the compensation circuit 60 and a base electrically connected to an output of the input stage bias circuit 65 at a node configured to receive the RF signal RF_IN.

The output stage NPN bipolar transistor 62 includes an emitter electrically connected to the power low supply voltage $V_1$, and a base electrically connected to a second terminal of the compensation circuit 60 and to an output of the output stage bias circuit 66. The output stage NPN bipolar transistor 62 further includes a collector electrically connected to a first end of the choke inductor 63 and to a first terminal of the output matching circuit 64. The choke inductor 63 further includes a second end that receives the power amplifier supply voltage $V_{CC\_PA}$ from the envelope tracker 30. The output matching circuit 64 further includes a second terminal that provides the amplified RF signal generated by the power amplifier 52 to the antenna 14 through the switches 12.

The input and output stage NPN bipolar transistors 61, 62 can be used to amplify the RF signal RF_IN to generate an amplified RF signal. For example, the input stage NPN bipolar transistor 61 can operate as a first amplification stage and the output stage NPN bipolar transistor 62 can operate as a second amplification stage. Although FIG. 5 illustrates a configuration using NPN bipolar transistors, other implementations of power amplifier stages can be used. In one embodiment, the input and output stage NPN bipolar transistors 61, 62 are heterojunction bipolar transistors (HBTs).

The output matching circuit 64 can be used to terminate the electrical connection between output of the power amplifier 52 and the switches 12. The output matching circuit 64 can be used to provide a desired load line impedance of the power amplifier 52 at the fundamental frequency of the RF signal RF_IN. For example, the output matching circuit 64 can provide an impedance transformation to achieve a desired load impedance for the power amplifier 52 when the power amplifier 52 is driving the antenna 14 through the switches 12. In certain implementations, the output matching circuit 64 can also be used to provide harmonic terminations, including, for example, a second harmonic short and/or a third harmonic open.

The choke inductor 63 can be included to aid in electrically powering the power amplifier 52 using the power amplifier supply voltage $V_{CC\_PA}$ generated by the envelope tracker 30. The choke inductor 63 can be used to provide low impedance to low frequency signal components, while choking or blocking high frequency signal components associated with the amplified RF signal.

The input and output stage bias circuits 65, 66 can be used to bias the input and output stage NPN bipolar transistors 61, 62, respectively. For example, in certain implementations the input stage bias circuit 65 is configured to bias the input stage NPN bipolar transistor 61 by controlling a base current and/or a base-emitter voltage of the input stage NPN bipolar transistor 61. Additionally, in certain implementations the output stage bias circuit 66 is configured to bias the output stage NPN bipolar transistor 62 by controlling a base current and/or base-emitter voltage of the output stage NPN bipolar transistor 62.

The envelope tracker 32 can control a voltage level of the power amplifier supply voltage $V_{CC\_PA}$ based on the envelope signal ENVELOPE. As the envelope tracker 32 changes the voltage level of the power amplifier supply voltage $V_{CC\_PA}$, an input impedance of the output stage NPN bipolar transistor 62 can change.

The compensation circuit 60 can be used to compensate for variation in an input impedance of the output stage NPN bipolar transistor 62 associated with changes in the voltage level of the power amplifier supply voltage $V_{CC\_PA}$. By including the compensation circuit 60, a variation in phase delay of the power amplifier 52 versus signal power can be reduced, thereby improving the power amplifier's AM/PM relative to scheme omitting the compensation circuit 60.

Input impedance variation of the output stage NPN bipolar transistor 62 can increase the nonlinearity of the power amplifier 52. For example, AM/PM can be degraded by a variation in an input reactance of the base of the output stage NPN bipolar transistor 62 associated with changes in voltage level of the power amplifier supply voltage $V_{CC\_PA}$. Thus, compensating for input impedance variation using the compensation circuit 60 can improve the AM/PM of the power amplifier 52.

Including the compensation circuit 60 can enhance the AM/PM performance of the power amplifier 52 relative to schemes using transceiver-level AM/PM reduction techniques alone. For example, with reference back to FIG. 3, the transceiver 33 can include the envelope shaping block 35, which can shape the signal envelope to achieve a substantially constant gain compression for the power amplifier 32. Although using the envelope shaping block 35 can improve the power amplifier's linearity and aid in improving AM/PM, the envelope shaping block 35 may not directly control AM/PM distortion, and thus an overall improvement in linearity may be limited. In contrast, the compensation circuit 60 can be integrated with the power amplifier, and can provide a low cost and effective solution to AM/PM improvement. For example, the compensation circuit 60 can be integrated on-chip with the power amplifier 52.

In one embodiment the compensation circuit 60 is configured to provide an inter-stage impedance match for the input and output stage NPN bipolar transistors 61, 62 that is the range of about 60 Ohm ($\Omega$) to about 70$\Omega$. By providing a relatively large inter-stage impedance match, a voltage swing at the collector of the input stage NPN bipolar transistor 61 can be relatively large, thereby reducing the impacts of the transistor's input impedance variation on AM/PM.

Figure 6:
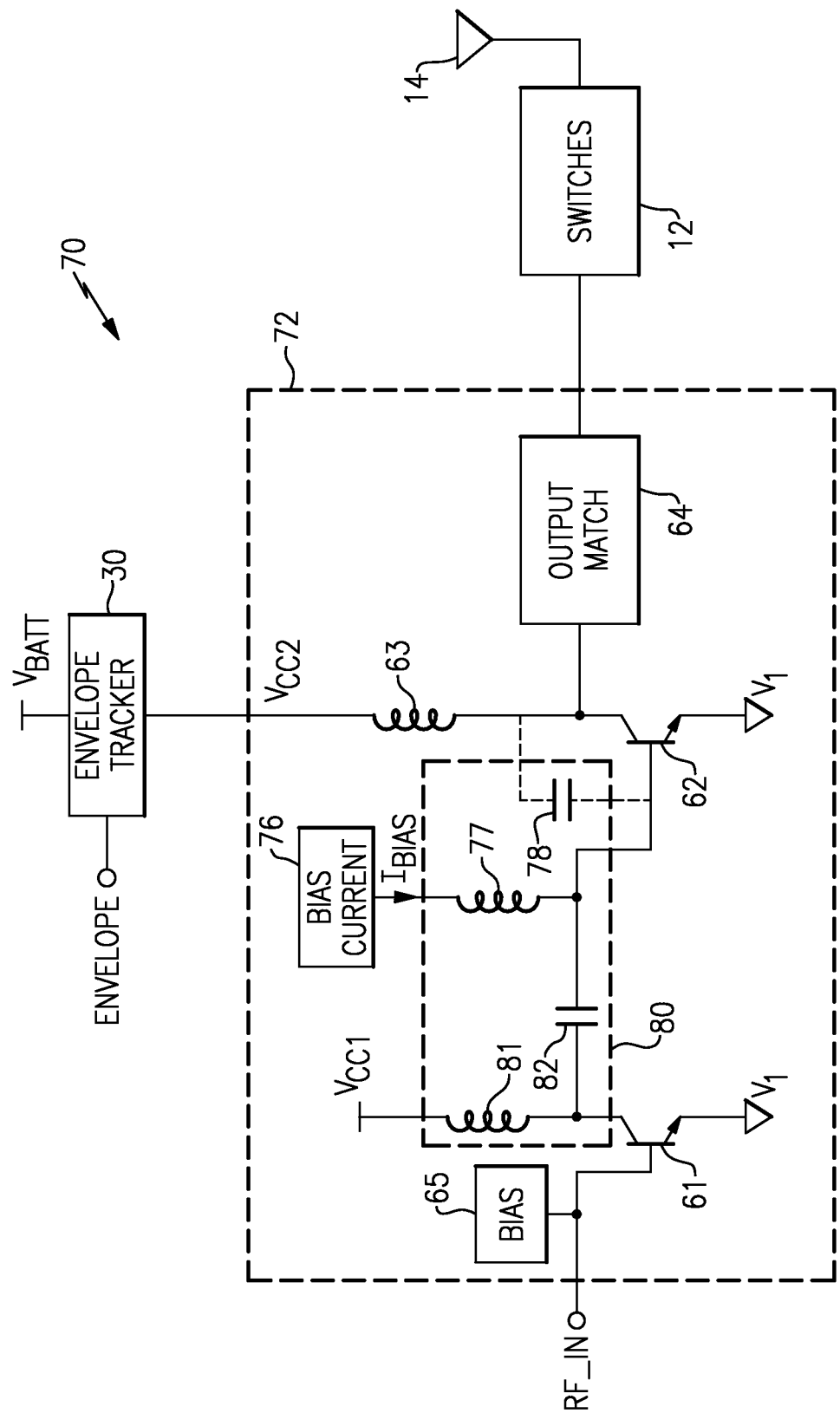
FIG. 6 is a circuit diagram of another embodiment of a power amplifier system including an envelope tracker.

FIG. 6 is a circuit diagram of another embodiment of a power amplifier system 70. The illustrated power amplifier system 70 includes the switches 12, the antenna 14, the envelope tracker 30, and a power amplifier 72. The power amplifier 72 includes a compensation circuit 80, the input stage NPN bipolar transistor 61, the output stage NPN bipolar transistor 62, the choke inductor 63, the output matching circuit 64, the input stage bias circuit 65, and an output stage bias current generation circuit 76.

The power amplifier system 70 of FIG. 6 is similar to the power amplifier system 50 of FIG. 5, except that the power amplifier 72 shown in FIG. 6 includes a different arrangement of an output stage bias circuit and a compensation circuit relative to the power amplifier 52 shown in FIG. 5. Additionally, the power amplifier system 70 illustrates a scheme in which the input stage NPN bipolar transistor 61 is electrically powered by a first power amplifier supply voltage $V_{CC1}$, while the output stage NPN bipolar transistor 62 is electrically powered by a second power amplifier supply voltage $V_{CC2}$ that is generated by the envelope tracker 30. In certain implementations, the first power amplifier supply voltage $V_{CC1}$ has a substantially constant or fixed voltage level over time.

The output stage bias current generation circuit 76 can be used to bias the output stage NPN bipolar transistor 62. For example, in the illustrated configuration, the base of the output stage NPN bipolar transistor 62 is configured to receive a bias current $I_{BIAS}$ from the output stage bias current generation circuit 76.

The compensation circuit 80 includes a bias inductor 77, a compensation inductor 81 and a compensation capacitor 82. The bias inductor 77 includes a first end electrically connected to the output stage bias current generation circuit 76 and a second end electrically connected to the base of the output stage NPN bipolar transistor 62. The compensation inductor 81 includes a first end electrically connected to the collector of the input stage NPN bipolar transistor 61 and a second end electrically connected to the first power amplifier supply voltage $V_{CC1}$. The compensation capacitor 82 includes a first end electrically connected to the collector of the input stage NPN bipolar transistor 61 and a second end electrically connected to the base of the output stage NPN bipolar transistor 62. The compensation circuit 80 can have components sized to provide a relatively small input impedance variation of the output stage NPN bipolar transistor 62 over time, such as an impedance variation that is less than about 15%.

When the envelope tracker 30 changes the voltage level of the second power amplifier supply voltage $V_{CC2}$ based on the envelope signal ENVELOPE, the input impedance of the output stage NPN bipolar transistor 62 can change. For example, the output stage NPN bipolar transistor 62 can have a parasitic base-collector capacitance 78 that can change in relation to the voltage level of the second power amplifier supply voltage $V_{CC2}$. Absent compensation, the changes in the parasitic base-collector capacitance 78 over time can degrade AM/PM. For example, changes in the parasitic base-collector capacitance 78 can generate variation in an input reactance of the base of the output stage NPN bipolar transistor 62. In one embodiment, the compensation circuit 80 is configured to compensate for an input reactance variation of the output stage NPN bipolar transistor 62 associated with changes in the parasitic base-collector capacitance 78 arising from varying transistor bias conditions associated with envelope tracking.

The illustrated power amplifier system 70 uses a scheme in which the bias inductor 77 has been included as part of the compensation circuit 80. In certain implementations, the bias inductor 77 has an impedance less than an impedance of a conventional choke inductor. For example, in one embodiment, the bias inductor 77 has an impedance at 1 GHz that is less than about 15Ω.

Configuring the bias inductor 77 in this manner can aid in allowing a portion porting of the amplified RF signal generated by the input stage NPN bipolar transistor 61 to reach the output stage bias current generation circuit 76, which can cause an amplitude of the bias current $I_{BIAS}$ to change in a manner that provides phase compensation to the power amplifier 72. For example, when an amplitude of the RF signal RF_IN is large, a portion of the amplified RF signal generated by the input stage NPN bipolar transistor 61 can reach the output stage bias current generation circuit 76 and cause an increase in the magnitude of the bias current $I_{BIAS}$, thereby providing phase compensation to the output stage NPN bipolar transistor 72. Accordingly, including the output stage bias current generation circuit 76 and the bias inductor 77 can improve the power amplifier's linearity and AM/PM.

Figure 7:
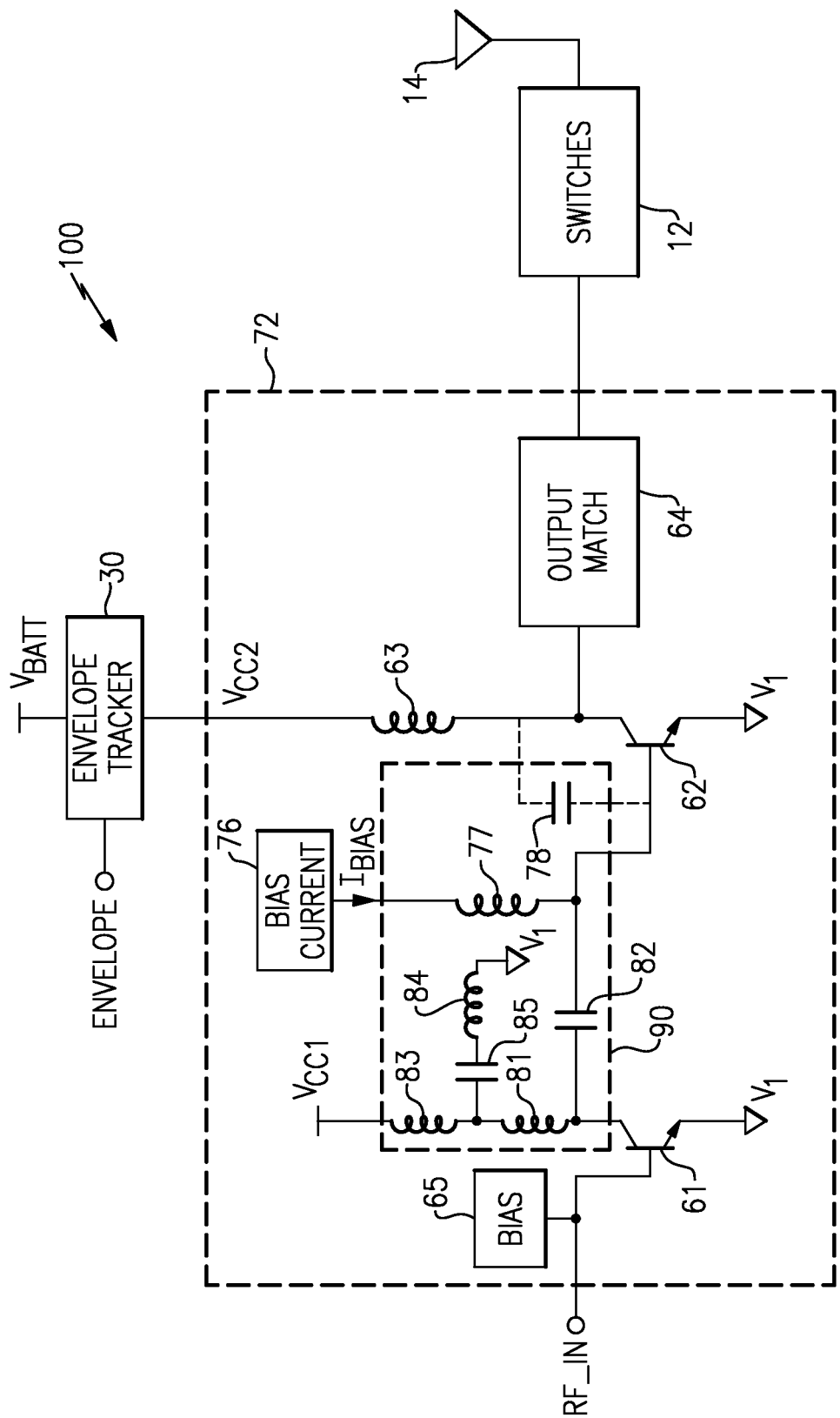
FIG. 7 is a circuit diagram of another embodiment of a power amplifier system including an envelope tracker.

FIG. 7 is a circuit diagram of another embodiment of a power amplifier system 100 including an envelope tracker. The illustrated power amplifier system 100 includes the switches 12, the antenna 14, the envelope tracker 30, and a power amplifier 72. The power amplifier 72 includes a compensation circuit 90, the input stage NPN bipolar transistor 61, the output stage NPN bipolar transistor 62, the choke inductor 63, the output matching circuit 64, the input stage bias circuit 65, and an output stage bias current generation circuit 76.

The power amplifier system 100 of FIG. 7 is similar to the power amplifier system 70 of FIG. 6, except that the power amplifier system 100 of FIG. 7 includes a different arrangement of a compensation circuit relative to the configuration shown in FIG. 6.

For example, the compensation circuit 100 of FIG. 7 includes the bias inductor 77, the first compensation inductor 81, the first compensation capacitor 82, a second compensation inductor 83, a third compensation inductor 84, and a second compensation capacitor 85. The bias inductor 77 includes a first end electrically connected to the output stage bias current generation circuit 76 and a second end electrically connected to the base of the output stage NPN bipolar transistor 62. The first compensation inductor 81 includes a first end electrically connected to the collector of the input stage NPN bipolar transistor 61 and a second end electrically connected to a first end of the second compensation capacitor 85 and to a first end of the second compensation inductor 83. The second compensation inductor 83 further includes a second end electrically connected to the first power amplifier supply voltage $V_{CC1}$. The second compensation capacitor 85 further includes a second end electrically connected to a first end of the third compensation inductor 84. The third compensation inductor 84 further includes a second end electrically connected to the power low supply $V_1$.

The illustrated compensation circuit 90 can aid in providing enhanced performance relative to certain other compensation circuit configurations. For example, the compensation circuit 90 of FIG. 7 can provide enhanced tuning that can aid in reducing variation in the power amplifier's phase delay versus input power relative to the compensation circuit 80 of FIG. 6. Additionally, in certain implementations the second compensation capacitor 85 and the third compensation inductor 84 can be configured to provide a relatively small impedance at the signal frequency, thereby helping to prevent amplified signals generated by the input stage NPN bipolar transistor 61 from reaching the first power amplifier supply voltage $V_{CC1}$.

Figure 8A:
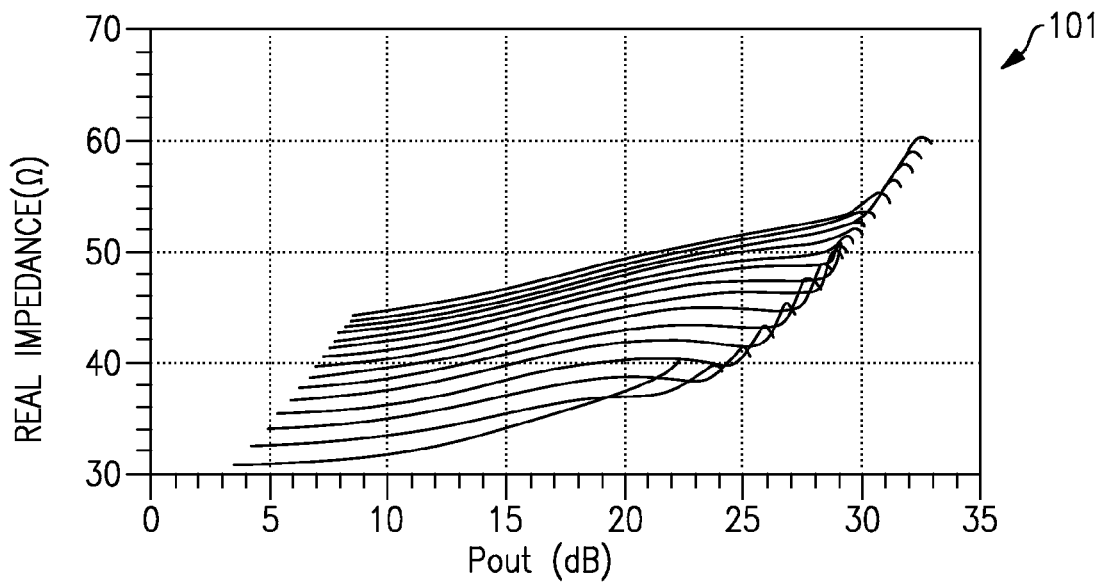
FIGS. 8A and 8B are graphs of one example of real and imaginary parts of impedance versus output power.
Figure 8B:
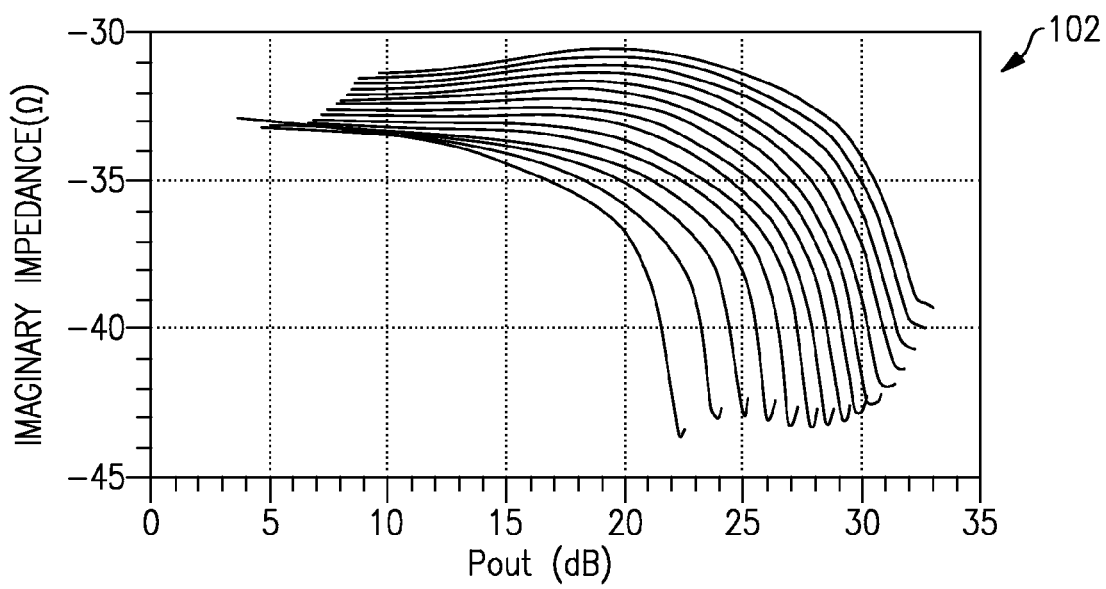

FIGS. 8A and 8B are graphs of one example of real and imaginary parts of impedance versus output power. The graphs correspond to measurement data taken for an implementation of the power amplifier 52 of FIG. 5 that omits the compensation circuit 60.

FIG. 8A illustrates a first graph 101 of a real part of inter-stage matching impedance versus output power. FIG. 8B illustrates a second graph 102 of an imaginary part of inter-stage matching impedance versus output power. The first and second graphs 101, 102 each include a plurality of plots associated with different voltage levels of the power amplifier supply voltage $V_{CC\_PA}$ that range between about 1.5 V and about 5.0 V. As shown in FIGS. 8A and 8B, a power amplifier lacking a compensation circuit can have a relatively large variation in inter-stage matching impedance. For example, the variation of the illustrated real part of inter-stage matching impedance is about 30Ω and the variation of the illustrated imaginary part of inter-stage matching impedance variation is about 10Ω.

Figure 9A:
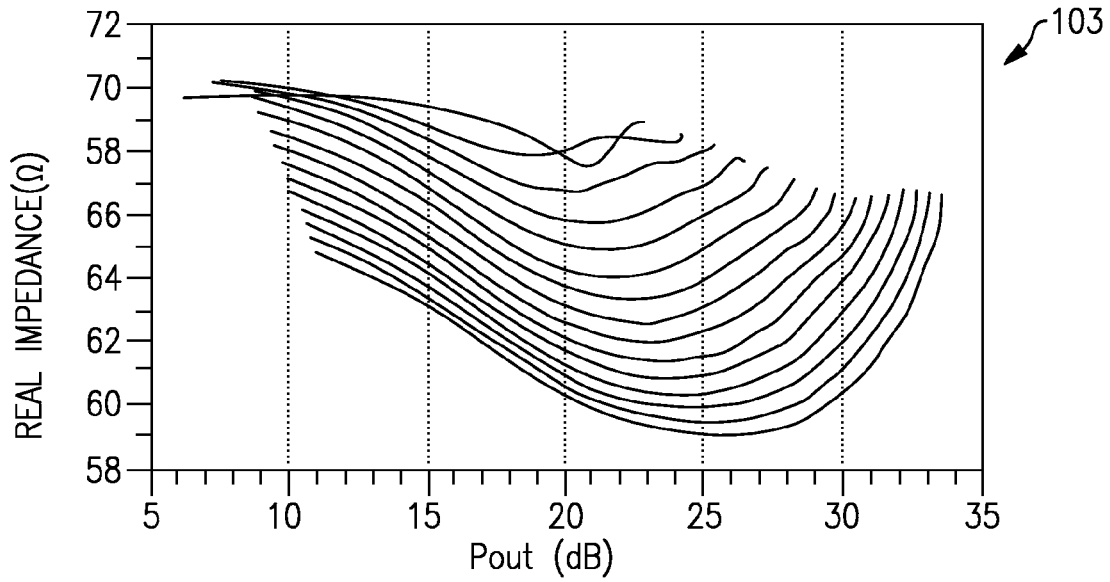
FIGS. 9A and 9B are graphs of another example of real and imaginary parts of impedance versus output power.
Figure 9B:
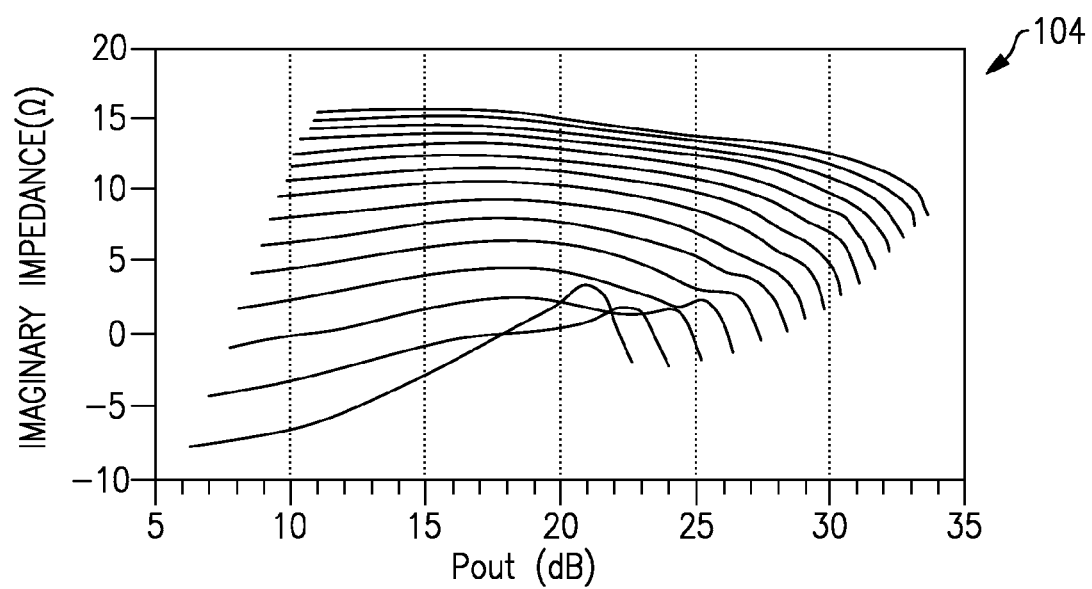

FIGS. 9A and 9B are graphs of another example of real and imaginary parts of impedance versus output power. The graphs correspond to measurement data taken for an implementation of the power amplifier 52 of FIG. 5, which includes a compensation circuit.

FIG. 9A illustrates a first graph 103 of a real part of inter-stage matching impedance of the output stage NPN bipolar transistor 62 versus output power. FIG. 9B illustrates a second graph 104 of an imaginary part of inter-stage matching impedance of the output stage NPN bipolar transistor 62 versus output power. The first and second graphs 103, 104 each include a plurality of plots associated with different voltage levels of the power amplifier supply voltage $V_{CC\_PA}$ that range between about 1.5 V and about 5.0 V. As shown in FIGS. 9A and 9B, including a compensation circuit can reduce variation in inter-stage matching impedance. For example, the variation of the illustrated real part of inter-stage matching impedance is about 7Ω and the variation of the illustrated imaginary part of inter-stage matching impedance is about 5Ω.

Figure 10A:
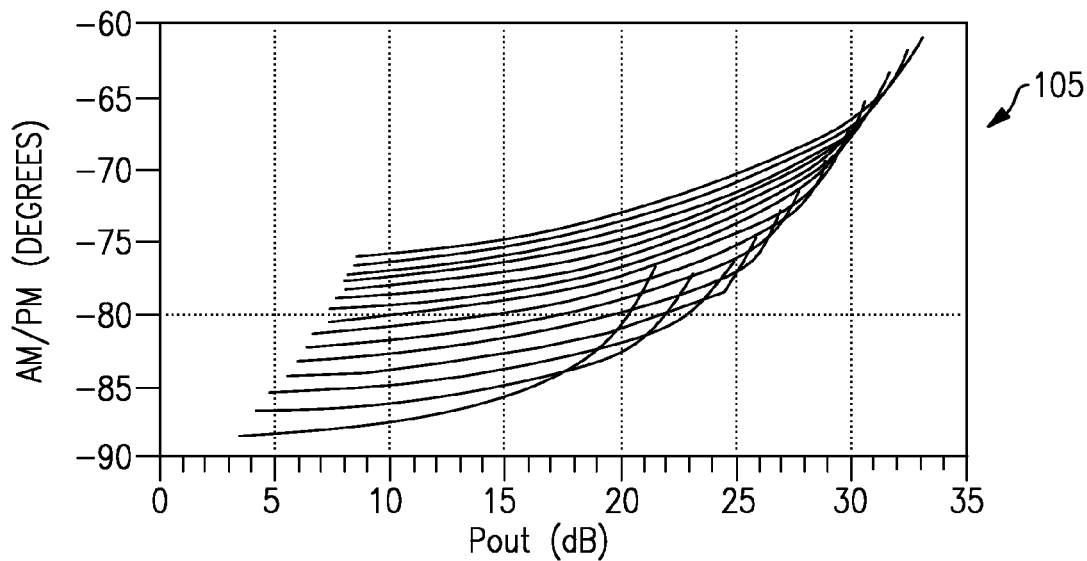
FIGS. 10A and 10B are graphs showing two examples of AM/PM versus output power.
Figure 10B:
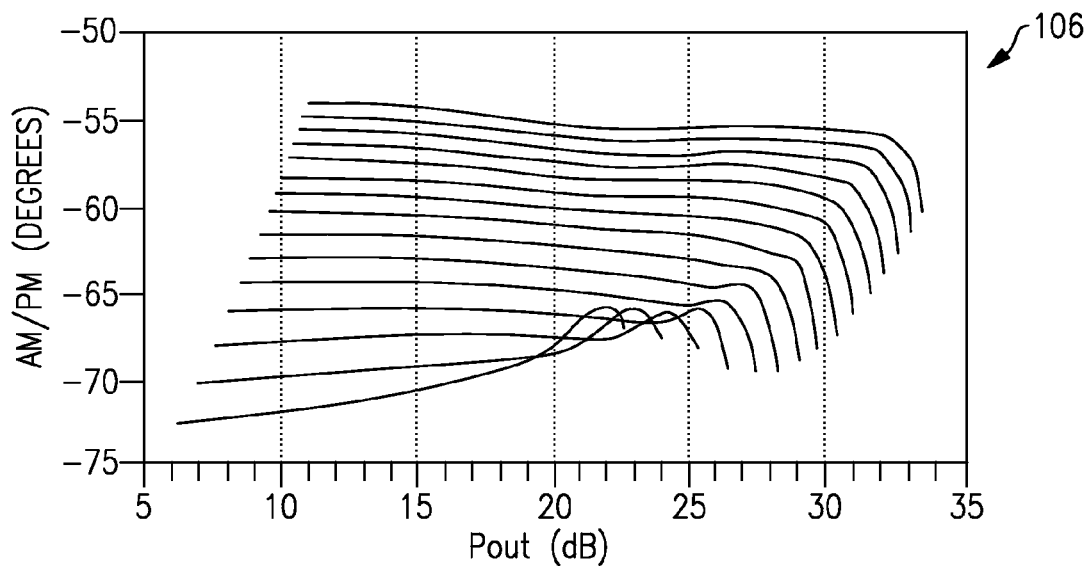

FIGS. 10A and 10B are graphs showing two examples of AM/PM versus output power. FIG. 10A illustrates a first graph 105 of AM/PM corresponding to the power amplifier associated with the graphs of FIGS. 8A and 8B. FIG. 10B illustrates a second graph 106 of AM/PM corresponding to the power amplifier associated with the graphs of FIGS. 9A and 9B. As shown by a comparison of FIG. 10A to FIG. 10B, including a compensation circuit can improve AM/PM.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of phase compensation in a power amplifier system, the method comprising:
    amplifying an input radio frequency (RF) signal to generate a first amplified RF signal using a first amplification stage of a power amplifier;
    generating a power amplifier supply voltage using an envelope tracker;
    controlling a voltage level of the power amplifier supply voltage based on an envelope of the input RF signal using the envelope tracker;
    powering a second amplification stage of the power amplifier using the power amplifier supply voltage from the envelope tracker;
    amplifying the first amplified RF signal to generate a second amplified signal using the second amplification stage, amplifying the first amplified RF signal to generate the second amplified signal including receiving the first amplified RF signal at a base of a bipolar transistor and generating the second amplified RF signal at a collector of the bipolar transistor; and
    compensating for a variation in an input impedance of the second amplification stage associated with changes in the voltage level of the power amplifier supply voltage using a compensation circuit.

2. The method of claim 1 further comprising providing a matching impedance between the first and second amplification stages that is in the range of about 60Ω to about 70Ω using the compensation circuit.

3. The method of claim 1, further comprising compensating for a variation in a parasitic capacitance between the base and the collector of the bipolar transistor associated with changes in the voltage level of the power amplifier supply voltage using the compensation circuit.

4. The method of claim 1 further comprising generating the RF signal and the envelope of the RF signal using a transceiver.

5. A power amplifier system comprising:
a first power amplifier stage including an input configured to receive an input radio frequency (RF) signal and an output configured to generate a first amplified RF signal;
an envelope tracker configured to generate a power amplifier supply voltage and to control a voltage level of the power amplifier supply voltage based on an envelope of the input RF signal;
a second power amplifier stage including an input configured to receive the first amplified RF signal and an output configured to generate a second amplified RF signal, the second power amplifier stage configured to be powered by the power amplifier supply voltage from the envelope tracker, the second power amplifier stage further including a bipolar transistor including a base configured to receive the first amplified RF signal and a collector configured to generate the second amplified RF signal; and
a compensation circuit electrically connected between the output of the first power amplifier stage and the input of the second power amplifier stage, the compensation circuit configured to compensate for variation in input impedance of the second power amplifier stage associated with changes in the voltage level of the power amplifier supply voltage.

6. The power amplifier system of claim 5 wherein the compensation circuit is configured to provide a matching impedance between the first and second power amplifier stages that is in the range of about 60Ω to about 70Ω.

7. The power amplifier system of claim 5 wherein the compensation circuit is configured to compensate for a variation in a parasitic capacitance between the base and the collector of the bipolar transistor associated with changes in the voltage level of the power amplifier supply voltage.

8. The power amplifier system of claim 5 wherein the compensation circuit includes a first compensation capacitor electrically connected between the input of the second power amplifier stage and an output of the first power amplifier stage.

9. The power amplifier system of claim 8 wherein the compensation circuit further includes a first compensation inductor electrically connected between the output of the first power amplifier stage and an input stage power supply.

10. A power amplifier system comprising:
a first power amplifier stage including an input configured to receive an input radio frequency (RF) signal and an output configured to generate a first amplified RF signal;
an envelope tracker configured to generate a power amplifier supply voltage and to control a voltage level of the power amplifier supply voltage based on an envelope of the input RF signal;
a second power amplifier stage including an input configured to receive the first amplified RF signal and an output configured to generate a second amplified RF signal, the second power amplifier stage configured to be powered by the power amplifier supply voltage from the envelope tracker; and
a compensation circuit electrically connected between the output of the first power amplifier stage and the input of the second power amplifier stage, the compensation circuit configured to compensate for variation in input impedance of the second power amplifier stage associated with changes in the voltage level of the power amplifier supply voltage, the compensation circuit including a first compensation capacitor electrically connected between the input of the second power amplifier stage and an output of the first power amplifier stage, a first compensation inductor electrically connected between the output of the first power amplifier stage and an input stage power supply, and a second compensation inductor electrically connected between the first compensation inductor and the input stage power supply, the first and second compensation inductors electrically connected at a first node.

11. The power amplifier system of claim 10 wherein the compensation circuit further includes a third compensation inductor and a second compensation capacitor electrically connected in series between the first node and a power low supply.

12. A power amplifier system comprising:
a first power amplifier stage including an input configured to receive an input radio frequency (RF) signal and an output configured to generate a first amplified RF signal;
an envelope tracker configured to generate a power amplifier supply voltage and to control a voltage level of the power amplifier supply voltage based on an envelope of the input RF signal;
a second power amplifier stage including an input configured to receive the first amplified RF signal and an output configured to generate a second amplified RF signal, the second power amplifier stage configured to be powered by the power amplifier supply voltage from the envelope tracker;
a compensation circuit electrically connected between the output of the first power amplifier stage and the input of the second power amplifier stage, the compensation circuit configured to compensate for variation in input impedance of the second power amplifier stage associated with changes in the voltage level of the power amplifier supply voltage, the compensation circuit including a first compensation capacitor electrically connected between the input of the second power amplifier stage and an output of the first power amplifier stage, and a first compensation inductor electrically connected between the output of the first power amplifier stage and an input stage power supply, and
an output stage bias current generation circuit configured to provide a bias current to the input of the second power amplifier stage.

13. The power amplifier system of claim 12 wherein the compensation circuit further includes a bias inductor configured to provide the bias current from the output stage bias current generation circuit to the input of the second power amplifier stage, the bias inductor configured to provide a portion of the first amplified RF signal to the output stage bias current generation circuit so as to provide phase compensation.

14. A mobile device comprising:
- a transceiver configured to generate a radio frequency (RF) signal and an envelope signal corresponding to an envelope of the RF signal;
- an envelope tracker configured to generate a power amplifier supply voltage and to control a voltage level of the power amplifier supply voltage based on the envelope signal;
- a plurality of power amplifier stages including a first power amplifier stage and a second power amplifier stage, the first power amplifier stage including an input configured to receive the RF signal and an output configured to generate a first amplified RF signal, the second power amplifier stage including an input configured to receive the first amplified RF signal and an output configured to generate a second amplified RF signal, the second power amplifier stage further configured to be powered by the power amplifier supply voltage from the envelope tracker, the second power amplifier stage further including a bipolar transistor including a base configured to receive the first amplified RF signal and a collector configured to generate the second amplified RF signal; and
- a compensation circuit electrically connected between the output of the first power amplifier stage and an input of the second power amplifier stage, the compensation circuit configured to compensate for variation in input impedance of the second power amplifier stage associated with changes in the voltage level of the power amplifier supply voltage.

15. The mobile device of claim 14 wherein the compensation circuit is configured to provide a matching impedance between the first and second power amplifier stages that is in the range of about 60Ω to about 70Ω.

16. The mobile device of claim 14 wherein the compensation circuit is configured to compensate for a variation in a parasitic capacitance between the base and the collector of the bipolar transistor associated with changes in the voltage level of the power amplifier supply voltage.

17. The mobile device of claim 14 wherein the transceiver includes an envelope shaping block for shaping the envelope signal to control a gain compression associated with the envelope tracker.

18. The mobile device of claim 14 further including an output stage bias current generation circuit configured to provide a bias current to the input of the second power amplifier stage.

19. The mobile device of claim 14 wherein the compensation circuit further includes a bias inductor configured to provide the bias current from the output stage bias current generation circuit to the input of the second power amplifier stage, the bias inductor configured to provide a portion of the first amplified RF signal to the output stage bias current generation circuit so as to provide phase compensation.

20. The mobile device of claim 14 wherein the compensation circuit further includes a first compensation capacitor electrically connected between the input of the second power amplifier stage and an output of the first power amplifier stage, a first compensation inductor electrically connected between the output of the first power amplifier stage and an input stage power supply, and a second compensation inductor electrically connected between the first compensation inductor and the input stage power supply, the first and second compensation inductors electrically connected at a first node.

* * * * *